United States Patent [19]
Kelling

[11] 3,711,783
[45] Jan. 16, 1973

[54] DIVISION WITH PULSE WIDTH MODULATION

[75] Inventor: Leroy U. C. Kelling, Waynesboro, Va.

[73] Assignee: General Electric Company

[22] Filed: Dec. 23, 1970

[21] Appl. No.: 100,920

[52] U.S. Cl. ....................... 330/86, 330/29, 330/110
[51] Int. Cl. ............................................... H03g 3/30
[58] Field of Search ...330/29, 86, 110; 328/127, 161

[56] References Cited

UNITED STATES PATENTS

| | | | |
|---|---|---|---|
| 3,315,223 | 4/1967 | Hibbard et al. | 330/86 UX |
| 3,373,959 | 3/1968 | Petersen | 330/86 X |
| 3,539,936 | 11/1970 | McGhee | 330/86 X |

*Primary Examiner*—Roy Lake
*Assistant Examiner*—James B. Mullins
*Attorney*—William S. Wolfe, Frank L. Neuhauser, Oscar B. Waddell and Joseph B. Forman

[57] ABSTRACT

A system for digitally controlling an amplifier wherein the transfer function of the amplifier is time modulated in accordance with a selectable digital number to make the amplifier gain an inverse function of the magnitude represented by the digital number. The digital number is preset into a digital circuit which controls the switching of a signal feedback impedance into and out of the feedback path of the amplifier on a time basis determined by the preset number.

12 Claims, 7 Drawing Figures

INVENTOR.
LEROY U. C. KELLING
BY *Michael Masnik*
HIS ATTORNEY

INVENTOR.
LEROY U. C. KELLING
BY Michael Masnik
HIS ATTORNEY

*INVENTOR.*
LEROY U. C. KELLING
BY *Michael Masnik*
HIS ATTORNEY

DIVISION WITH PULSE WIDTH MODULATION

BACKGROUND OF THE INVENTION

The present invention relates to a digitally controlled electronic amplifier and more particularly to a method and apparatus for modulating the gain of an amplifier by digitally controlling the transfer function thereof.

In various control applications, particularly in the numerical control of machine tools, it may be desirable to control the gain of an amplifier in inverse relation to a magnitude represented by a digital number. For example, an amplifier may be designed to provide a particular output voltage at 100 percent system capability and yet under certain conditions, it may be desirable to operate the system at less than full capability.

While amplifier systems of this type are known, they often lack the speed and accuracy required for a particular application. Further, numerous and extremely accurate, and therefore extremely expensive, components are required to provide sufficient accuracy and speed.

It is therefore an object of the present invention to provide a novel digitally controlled amplifier system.

It is another object of the present invention to provide a novel method and apparatus for modulating the gain of an amplifier with a digital signal.

It is yet another object of the present invention to provide a novel method and apparatus for selectively varying the feedback path of an amplifier in a highly accurate and extremely simple manner.

Briefly, these and other objects and advantages which will be apparent from the claims and detailed description of a preferred embodiment are accomplished by providing an amplifier having a signal feedback path which at least partially determines the transfer function of the amplifier. The signal feedback path is modified in accordance with digital output signals having a selectable phase relationship, thereby modifying the transfer function of the amplifier, for a selectable percentage of the predetermined time period.

BRIEF DESCRIPTION OF THE DRAWINGS

While the specification concludes with claims particularly pointing out and distinctly claiming the subject matter which is regarded as the invention, an illustration of a particular embodiment can be seen by referring to the following specification in connection with the accompanying drawings in which:

DESCRIPTION OF THE PREFERRED EMBODIMENT

Figure 1:
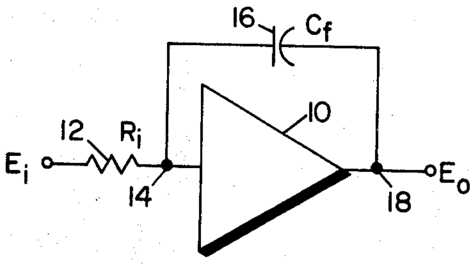
FIG. 1 PRIOR ART
FIG. 1 is a schematic diagram of an integrating amplifier.

FIG. 1 is a conventional operational amplifier connected in a conventional manner to perform an integrating operation. An input impedance 12, e.g., a resistor $R_i$, is connected to an input terminal 14 of the amplifier 10 and a feedback impedance 16 such as a capacitor $C_f$ is connected between the output terminal 18 and the input terminal 14 of the amplifier 10.

With an input signal $E_i$ applied to the input terminal 14 of the operational amplifier 10 by way of the input resistor 12, the output signal $E_o$ and the transfer function $T_f$ of the amplifier circuit, i.e., the ratio of the output signal $E_o$ to the input signal $E_i$, are given respectively in Laplace notation as a function of S by the following equations:

$$E_o(S) = -E_i(S)/R_iC_fS = -(E_i(S)/R_iC_f)(1/S) \quad (1)$$

$$T_f(S) = -(1/R_iC_f)(1/S) \quad (2)$$

With a unit step or pulse input signal applied to the input terminal 14 by way of the resistor 12, the output voltage as a function of $S$ is given by the following equation:

$$E_o(S) = -(1/R_iC_f)(1/S^2) \quad (3)$$

The output voltage is thus given as a function of time ($t$) by the following equation:

$$E_o(t) = -(1/R_iC_f)(t) = -Kt \quad (4)$$

where $K = 1/R_iC_f$.

Figure 3:
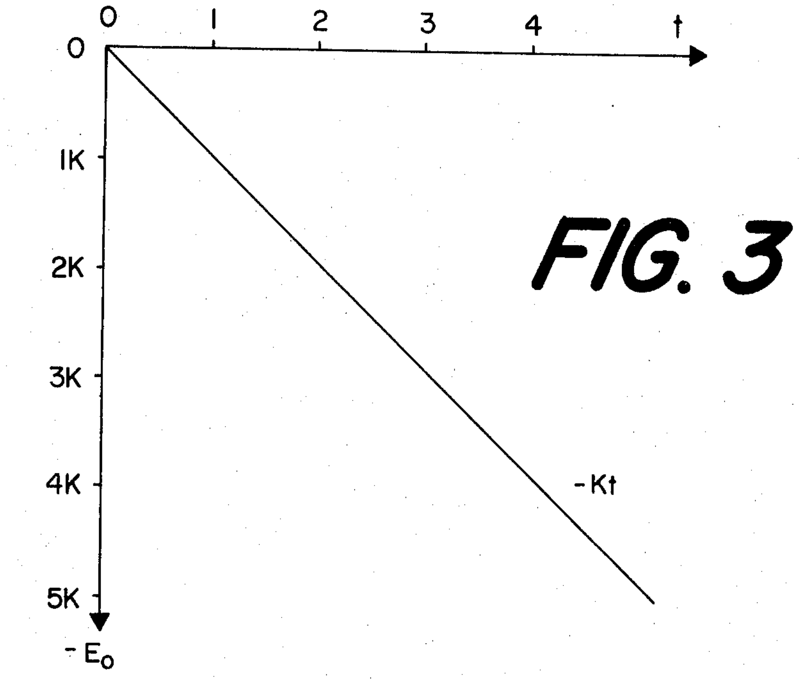
FIG. 3 is a graph illustrating the output voltages of the amplifier of FIG. 1, plotted with respect to time with a step or pulse input signal.

As illustrated in FIG. 3, the output voltage $E_o$ of the amplifier of FIG. 1 is linearly related to time. Thus, assuming that a unit step function is applied to the integrating amplifier of FIG. 1, the output voltage at the end of one second will be −K volts.

Figure 2:
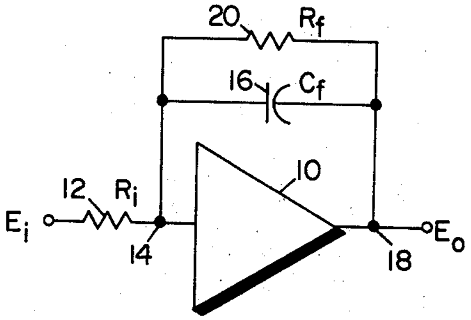
FIG. 2 PRIOR ART
FIG. 2 is a schematic diagram of the integrating amplifier of FIG. 1, with the addition of a feedback resistor.

The amplifier of FIG. 2 is also conventional and is identical to that of FIG. 1, with the exception of the addition of a feedback impedance 20, such as a resistor $R_f$. The output signal $E_o$ and the transfer function $T_f$ of the amplifier of FIG. 2 are given in Laplace notation as a function of S, by the following equations:

$$E_o(S) = -\frac{E_i(S)}{(R_iC_f)\left(S+\frac{1}{R_fC_f}\right)} = -\frac{R_f}{R_i}\left(\frac{E_i(S)}{1+R_fC_fS}\right) \quad (5)$$

$$T_f(S) = -\left(\frac{1}{R_iC_f}\right)\left(\frac{1}{S+\frac{1}{R_fC_f}}\right) = -\left(\frac{R_f}{R_i}\right)\left(\frac{1}{1+R_fC_fS}\right) \quad (6)$$

Assuming once again that a unit step or pulse input signal is applied to the amplifier of FIG. 2, the output signal as a function of S is given by the equation:

$$E_o(S) = -(R_f/R_i)\,[(E_i(S)/(1+R_fC_fS)]\,(1/S) \quad (7)$$

which when transformed into a function of time gives the following equation:

$$E_o(t) = K\left[1-e^{-\left(\frac{1}{R_fC_f}\right)t}\right] \quad (8)$$

where $K = R_f/R_i$.

It is apparent from Equation (8) that, with a unit step input voltage applied to the amplifier of FIG. 2, the output voltage of the amplifier of FIG. 2 is a negative voltage which rises exponentially from $t = 0$ toward a maximum value of $-R_f/R_i$. Thus, as illustrated in FIG. 4, the output voltage of the amplifier circuit of FIG. 2 plotted with respect to time increases exponentially in a negative direction and approaches the value of −K volts.

Figure 4:
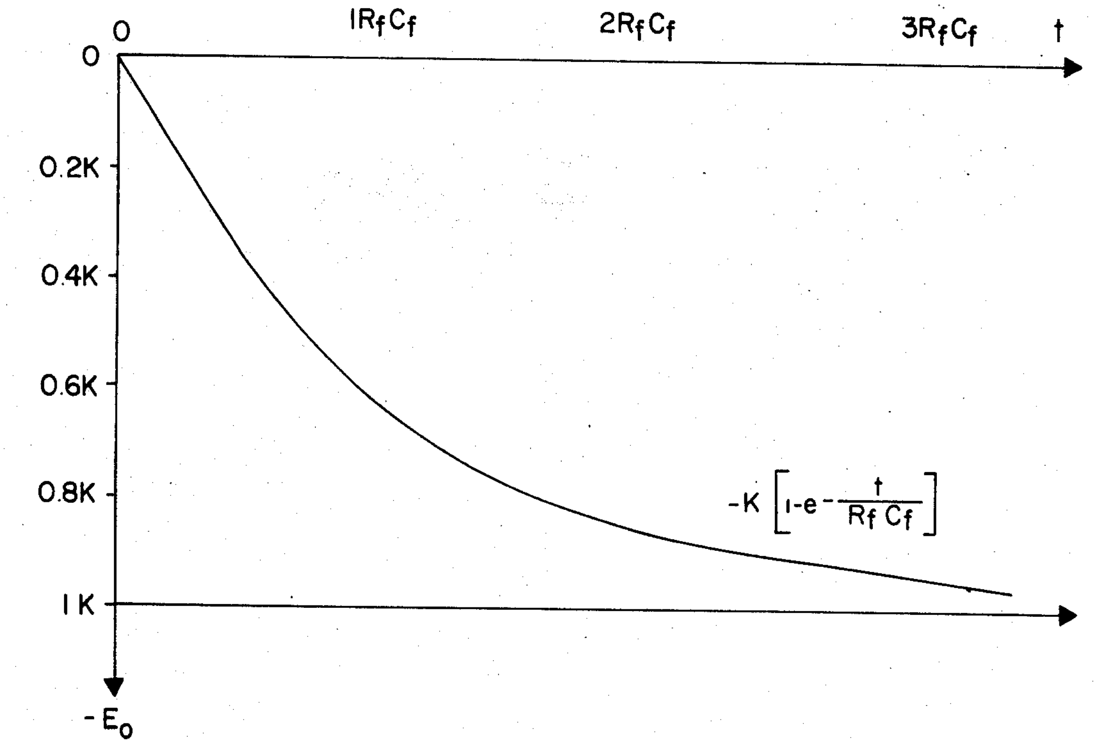
FIG. 4 is a graph illustrating the output voltage of the amplifier of FIG. 2, plotted with respect to time with a step or pulse input signal.

It can be seen from the graphs of FIGS. 3 and 4 that the transfer function, and thus the gain characteristics of an operational amplifier circuit may be selectively varied by adding passive components, such as resistors and capacitors to obtain almost any desired output signal at the end of the predetermined time period. For example, by connecting a number of feedback impedances in parallel with the feedback impedance 16 of the operational amplifier circuit of FIG. 1 and by connecting switches in series with each of these additional impedances, the transfer function, and therefore the output signal of the operational amplifier may be selectively varied by selecting various combinations of the parallel impedances. This prior art technique would result in a number of discrete, incrementally displaced curves. In order to obtain a desired range of selectable gain characteristics, numerous, extremely accurate components are generally required. Each of the characteristic curves is fixed and is incrementally spaced from the adjacent curves. Thus, there are a generally quite limited number of gain characteristics which can be obtained with this prior art arrangement.

The hybrid amplifier of the present invention obviates these difficulties by providing a digitally controlled analog operational amplifier system which utilizes two different amplifier characteristic curves such as those of FIGS. 3 and 4 to obtain a substantially continuously and extremely accurately variable output signal response. A preferred embodiment of the present invention which provides these and other desirable results is illustrated in FIG. 5.

Figure 5:
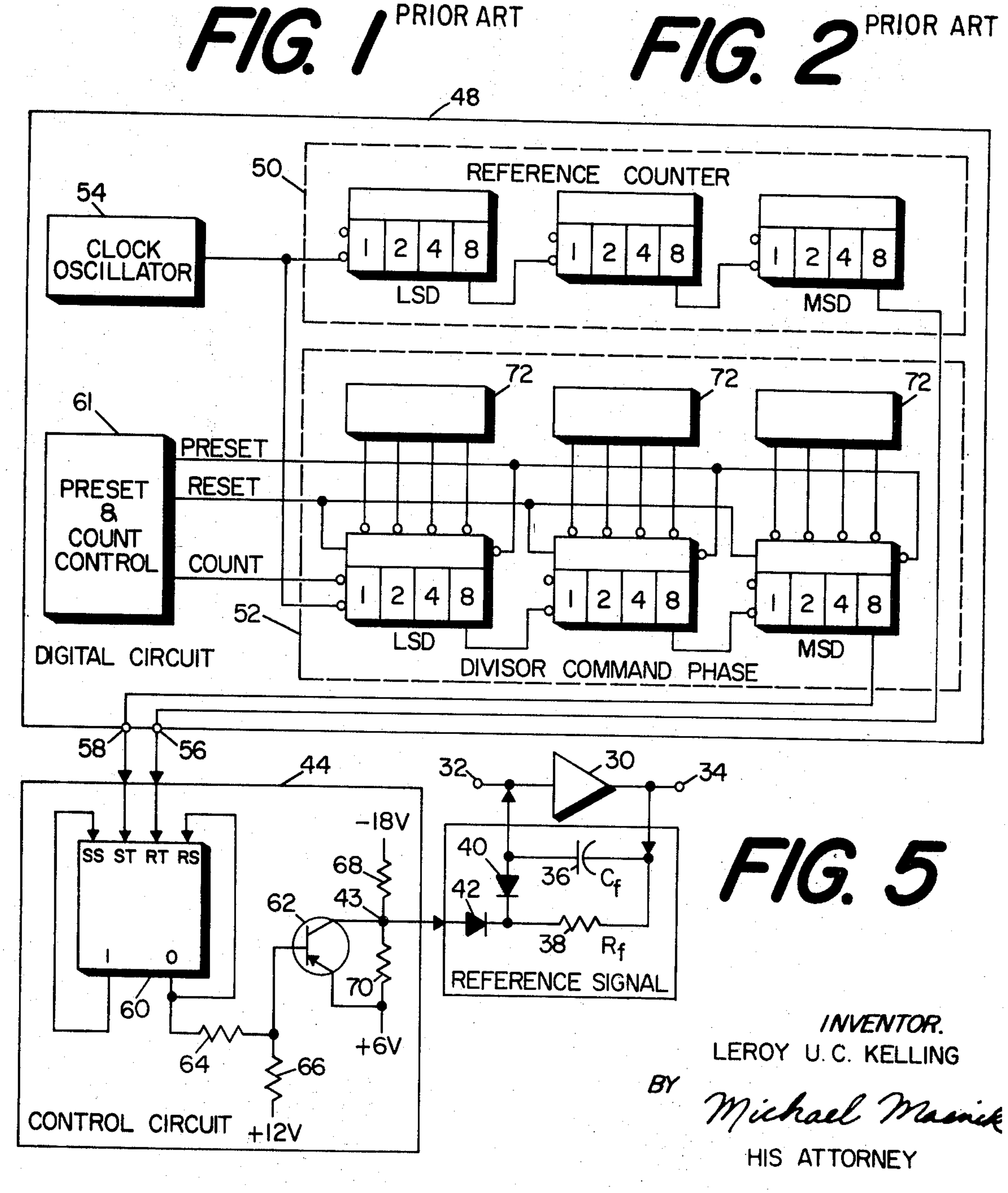
FIG. 5 is an electrical schematic diagram of a preferred embodiment of the hybrid amplifier of the present invention.

With reference now to FIG. 5, an operational amplifier 30 is shown with an input terminal 32 and output terminal 34. A first signal feedback impedance 36, e.g., a capacitor $C_f$, is connected between the output terminal 34 and the input terminal 32 of the amplifier. The capacitor 36 is selected to provide an amplifier transfer or gain characteristic which follows the line 22 of FIG. 7 with a step function or pulse input signal as previously described. A second signal feedback impedance 38, preferably a resistor $R_f$, is connected in series with a semiconductor diode 40 between the output terminal 34 and the input terminal 32. The resistor 38 may be selected to provide, in combination with the capacitor 36, an amplifier transfer or gain characteristic plotted as the line 21 of FIG. 7 under the previously described conditions.

As illustrated in FIG. 5, the anode electrode of the diode 40 is directly connected to the input terminal 32, and the cathode electrode thereof is connected to one side of the resistor 38. The cathode electrode of a second semiconductor diode 42 is connected to the cathode electrode of the diode 40 and the anode electrode of the diode 42 is connected to the output terminal 43 of a control circuit 44 hereinafter to be described.

The control signal applied to the anode electrode of the diode 42 from the control circuit 44 switches between positive and negative voltage levels in accordance with a selectable timing sequence. A portion of the negative output signal from the operational amplifier 30 is continuously fed back to the input terminal 32 by way of the feedback impedance 36. The negative output signal is also fed back to the diode 40 and 42 junction through the feedback impedance 38.

Since the anode electrode of the diode 40 is connected to the input terminal 32 of the operational amplifier 30 which is at virtual ground, the diode 40 will pass any negative signal which exceeds the forward breakdown voltage thereof. The diode 42 is also poled to pass a negative signal applied to the intersection between the diodes 40 and 42.

The conduction of the diode 42 is controlled by the voltage level applied to the anode electrode thereof by the control circuit 44. If this voltage level is positive, the diode 42 will be biased into conduction to back bias the diode 40. This prevents the diode 40 from conducting and thus prevents the application of a feedback signal to the input terminal 32 by way of the feedback impedance 38. However, when the voltage level at the anode electrode of the diode 42 is negative, the diode 42 is back biased and the feedback signal is coupled to the input terminal 32 by way of the diode 40.

As previously described, the control signal switches between a positive and a negative voltage level in accordance with a selectable timing sequence. This control signal is applied to the anode electrode of the diode 42 to effectively switch the feedback impedance 38 into and out of the feedback path of the operational amplifier 30 in accordance with this selectable timing sequence.

With continued reference to FIG. 5, the selectable timing sequence for selectively controlling the percentage of time during which the feedback resistor 38 affects the transfer function of the operational amplifier 30 is preferably provided by a digital circuit 48. The digital circuit 48 includes a reference counter 50 and a divisor command phase counter 52, both of which may be connected to a source of constant frequency digital pulses such as a conventional clock oscillator 54.

Figure 6:
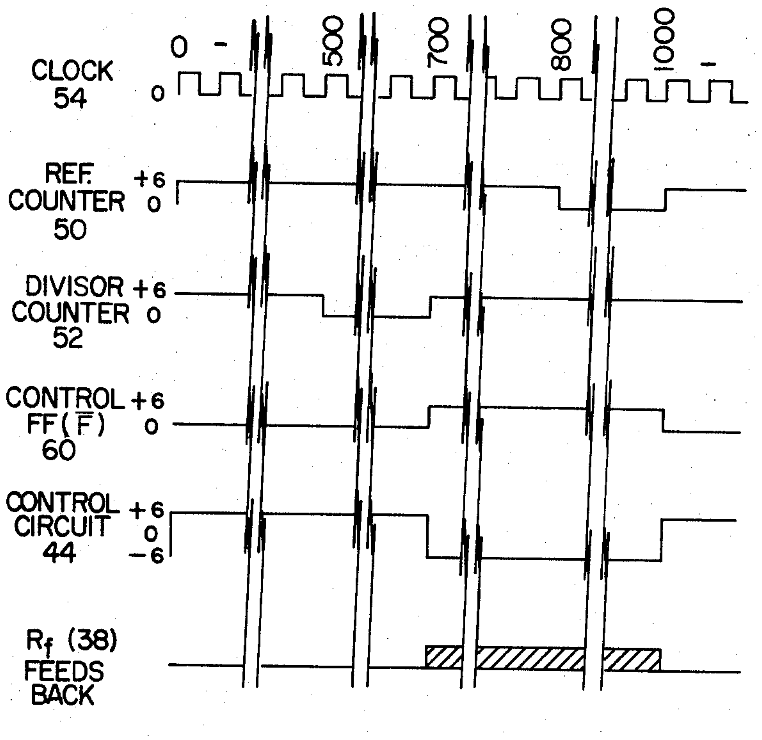
FIG. 6 is a series of waveforms illustrating the operation of the hybrid amplifier of FIG. 5.

The reference counter 50 is preferably a conventional three decade, serial BCD counter providing a digital reference signal at an output terminal 56. The reference signal is taken from the reset side of the eight bit of the most significant digit (MSD) decade. As illustrated in FIG. 6, the reference signal is thus a binary signal which assumes its high signal level with the first reference pulses, goes low upon receipt of the 800th pulse, and again becomes high when 1,000 pulses have been counted. Thus, a positive going reference signal which determines the start of a predetermined time period is provided for every 1,000 clock pulses counted by the reference counter 50. The output signal from the reference counter 50 thus defines a predetermined time period which is related to the frequency of the clock oscillator 54 and the number of decades in the reference counter 50.

The divisor command phase counter 52 may be identical to the reference counter 50 to provide a digital output signal at an output terminal 58 which is the same as the reference signal but which may be phase shifted therefrom by a selectable amount. The amount of phase shift introduced between the output signals from the counters 50 and 52 is initially obtained by presetting the desired digital number into the divisor command phase counter 52 prior to the application of the first clock pulse to the counters, i.e., just prior to $t = 0$ determined by the reference counter 50. The presetting of the divisor command phase counter 52 is synchronized with the reference counter 50 in a conventional manner by a conventional preset and count control circuit 61 which controls the resetting, presetting and counting of the clock pulses by the divisor command phase counter 52. This may be accomplished, for example, by synchronizing the preset and count control circuit 61 in accordance with the total count of the reference counter 50. Synchronization of two counters in this manner is well known in the art. The circuitry is a matter of design choice and will therefore not be discussed in detail.

The reference signal and the phase shifted signal from the respective output terminals 56 and 58 of the counters 50 and 52 are applied respectively to the reset trigger and the set trigger terminals of a conventional bistable multivibrator or flip-flop 60 in the control circuit 44. The flip-flop 60 is self-steered and thus resets when a positive going pulse or trigger is applied to the reset trigger only if the flip-flop is in the set condition prior to the arrival of the positive going trigger. The flip-flop 60 is set by a positive going signal applied to the set trigger only if the flip-flop is previously in the reset condition when the positive going signal arrives.

An output signal from the reset side of the flip-flop 60 is applied to the base electrode of a transistor 62 by way of a resistor 64. The transistor 62 is preferably a conventional NPN switching transistor connected in a conventional common emitter switching circuit configuration. The transistor 62 is biased in a conventional manner so that when the flip-flop 60 is reset and supplies a low or binary ZERO output signal to the base electrode, the output signal of the transistor 62 coupled from the collector electrode thereof is a positive 6 volt level. When the flip-flop 60 is set and supplies a high or binary ONE output signal to the base electrode, the output signal of the transistor 62 is a negative 6 volt level.

Proper biasing of the transistor 62 may be provided by connecting the base electrode to a positive 12 volt supply through a resistor 66, by connecting the emitter electrode directly to a positive 6-volt supply and by connecting the collector electrode to a negative 18-volt supply by way of a resistor 68. A resistor 70 may be connected between the emitter electrode and the collector electrode to complete the switching circuit. The output signal may then be coupled directly from the collector electrode of the transistor 62 and applied to the anode electrode of the diode 42 in the signal feedback circuit as previously described.

Typical values of components which may be utilized in the switching circuit are as follows:

| Component | Value |
|---|---|
| Resistor 64 | 4K ohm |
| Resistor 66 | 18K ohm |
| Resistor 68 | 3K ohm |
| Resistor 70 | 3K ohm |

The operation of the digital circuit 48 and the control circuit 44 may be more clearly understood by reference to the following example. As previously described, the reference counter 50 is preferably a three decade, serial BCD counter which counts continuously to 1,000 in a cyclical manner. The reset side of the eight bit of the last decade, i.e., the MSD decade, is connected to the reset trigger of the control flip-flop 60. As illustrated in FIG. 6, at $t = 0$ a positive going signal is applied to the control flip-flop 60 from the reference counter 50. The control flip-flop 60 resets and remains in that condition until a positive going signal is applied to the set input trigger from the divisor command phase counter 52. Since the output signal from the control flip-flop 60 goes negative at $t = 0$, the output signal from the control circuit 44 is a positive 6 volt level after $t = 0$ and the feedback resistor 38 is not in the feedback path of the amplifier 30.

With continued reference to FIG. 6, when 800 pulses have been counted, the output signal from the reset side of the eight bit of the MSD decade switches to a binary ZERO level and remains at this level unit 1,000 pulses have been counted. The 1,000th clock pulse resets all of the decades of the reference counter to zero and signifies the beginning of a new time period.

Referring to FIG. 5, the divisor command phase counter 52 is also preferably a three decade serial BCD counter which counts in synchronism with the reference counter 50. Each decade of the divisor command phase counter 52 may be preset to a desired number in a suitable conventional manner, such as by the thumb wheels 72. With no number preset into the counter 52, the output signal taken from the reset side of the eight bit of the MSD decade is identical to that from the reference counter 50. However, by presetting the number 300 into each of the decades just prior to $t = 0$, the signal from the eight bit of the MSD decade of the divisor command phase counter 52 goes low after 500 pulses have been counted and goes high after 700 pulses have been counted. Thus, the output signal from the divisor command phase counter 52 is a binary ONE signal until 500 pulses have been counted, switches to a binary ZERO signal upon receipt of the 500th clock pulse, and then switches back to a binary ONE output signal upon receipt of the 700 th clock pulse. This output signal is repeated cyclically as long as the number 300 is present into the divisor command phase counter 52 and presents a constant 30 percent phase difference with respect to the signal from the reference counter 50.

Since this signal from the divisor command phase counter 52 is applied to the set trigger of the control flip-flop 60, and since the control flip-flop 60 is reset at $t = 0$, the signal from the divisor command phase counter 52 sets the control flip-flop 60 upon receipt of the 700th clock pulse. When the control flip-flop 60 sets, the reset side switches to a binary ONE output signal causing the output signal from the control circuit 44 to switch from a positive 6-volt level to a negative 6-volt level as illustrated. This in turn causes the feedback resistor 38 to be effectively switched into the signal feedback path of the operational amplifier 30 upon receipt of the 700th clock pulse.

Thus, it can be seen from the above example that by presetting the number 300 into the divisor command phase counter 52, the feedback resistor 38 is connected in the feedback path of the amplifier 30 during the last 300 pulses of the clock oscillator and is effectively disconnected from the feedback path of the amplifier 30 during the first 700 pulses of the time period determined by the reference counter 50.

By switching the feedback resistor 38 into and out of the feedback path of the amplifier 30 as described above, the average gain of the amplifier 30 over a predetermined time period is inversely related to the number preset into the divisor command phase counter 52. This relationship may be more clearly understood by referring to the graph of FIG. 7.

Figure 7:
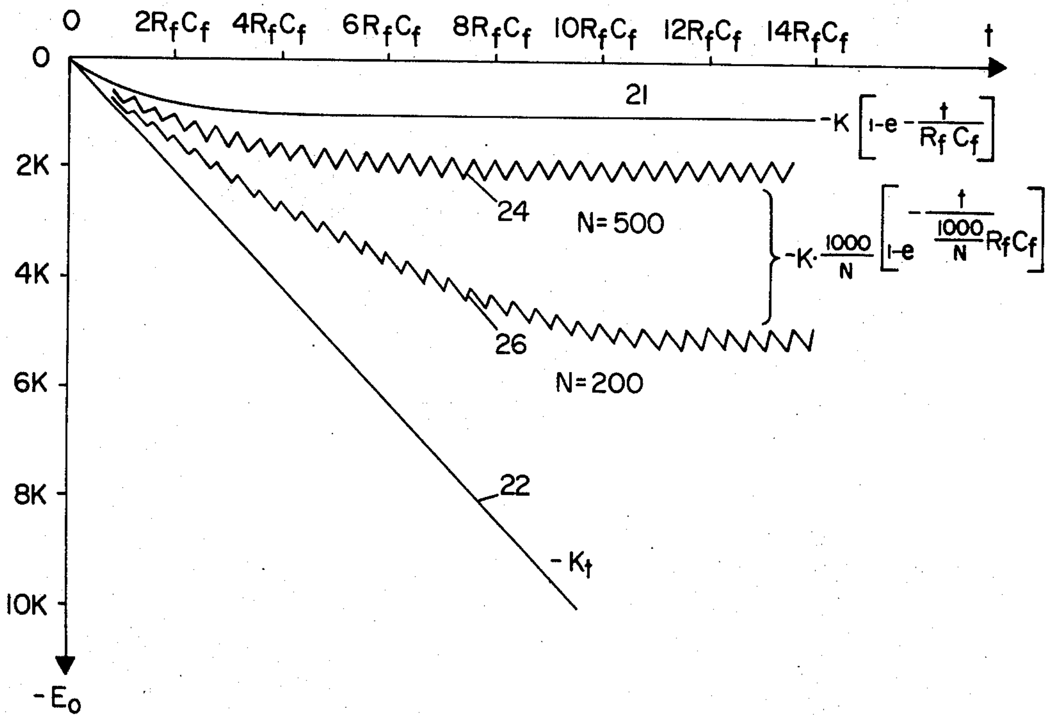
FIG. 7 is a graph illustrating the output voltage of the amplifier of FIG. 5, plotted with respect to time for various control conditions.

With reference now to FIG. 7, the operational amplifier of FIG. 1 provides an output voltage with respect to time which generally follows the line 22. The operational amplifier of FIG. 2 provides an output voltage with respect to time which generally follows the line 21. The constant K of Equation (4) has been assumed equal to the constant K of Equation (8) to facilitate illustration of the curves.

The total time period of one cycle of the reference counter 50 is, by way of example, 40 percent of one time constant $R_fC_f$ of the amplifier of FIG. 2. With a number N set into the divisor command phase counter 52, the transfer function $T_f$ of the amplifier 30 is given as a function of the Laplace operator S by:

$$T_f(S)=\frac{E_o(S)}{E_i(S)}=-\frac{1000R_f}{NR_i}\left[\frac{1}{1+\left(\frac{1000}{N}\right)(R_fC_f)S}\right] \quad (9)$$

The output voltage of the amplifier 30 is thus given as a function of time by the equation:

$$E_o(t)=-E_i(t)\left(\frac{R_f}{R_i}\right)\left(\frac{1000}{N}\right)\left[1-e^{-\frac{t}{\left(\frac{1000}{N}\right)R_fC_f}}\right] \quad (10)$$

or $$E_o(t)=-(K)\left(\frac{1000}{N}\right)\left[1-e^{-\frac{t}{\left(\frac{1000}{N}\right)R_fC_f}}\right]$$

where $K=R_f/R_i$ and $E_i(t)$ is a unit step.

With continued reference to FIG. 7, the curves 24 and 26 illustrate the output signals of the amplifier 30 when the number N preset into the divisor command phase counter 52 is equal to 500 and 200, respectively. It can be seen from the curves 24 and 26 that, after approximately five time constants of the amplifier 30, the average value of the output voltage of the amplifier 30 of FIG. 5 is inversely related to the number N in the divisor command phase counter 52. It can further be seen that the time constant of the feedback network of the amplifier 30 is also inversely related to the number N, i.e., the time constant equals (1,000/N) $R_fC_f$.

In the example supra, the resulting output signal illustrated in FIG. 7 thus attains a value at the end of the predetermined time period which is approximately 1000/200 or 500 percent of the maximum amplifier gain.

The above time periods are, of course, only exemplary. In actual practice, the time periods involved may be much shorter since the frequency of the input signals applied to the operational amplifier may be on the order of 250 kilohertz. However, by making the RC time constants of the amplifier circuit considerably longer than the predetermined period of the input signal as previously described, the present invention may be utilized in diverse control applications.

Although the present invention has been described with respect to a particular embodiment, the principles underlying this invention will suggest many additional modifications of this particular embodiment to those skilled in the art. Therefore, it is intended that the appended claims shall not be limited to the specific embodiment shown, but rather shall cover all such modifications as fall within the true spirit and scope of the present invention.

What is claimed is:

1. A digitally controlled amplifier comprising:

a. amplifier means for providing an output signal related to an input signal by a transfer function;

b. input circuit means operatively connected to said amplifier means for applying the input signal thereto;

c. output circuit means operatively connected to said amplifier means for obtaining the output signal therefrom;

d. digital circuit means for providing digital output signals having a selectable phase relationship therebetween;

e. signal feedback means operatively connected between said output circuit means and said input circuit means for at least partially determining the transfer function of said amplifier; and f. control circuit means operatively connected to said digital circuit means and said signal feedback means for modifying the transfer function of said amplifier for a selectable percentage of a predetermined time period, said selectable percentage being proportional to the phase relationship between said digital output signals.

2. The amplifier of claim 1 wherein said digital circuit means comprises:

1. pulse generating means for generating a series of electrical pulses; and,
2. circuit means operatively connected to said pulse generating means for providing first and second digital output signals of the same frequency having a selectable phase difference between the pulses thereof.

3. The digitally controlled amplifier of claim 2 wherein said circuit means comprises:

1. first pulse counting means for providing a first output signal in response to the counting of a predetermined number of pulses of said series of pulses;
2. second pulse counting means for providing a second output signal in response to the counting of a predetermined number of pulses of said series of pulses; and,
3. preset circuit means operatively connected to said second counting means for presetting a selectable digital number into said second counting means, whereby a phase difference proportional to said selectable digital number is introduced between the output signals of said first and second counting means.

4. The digitally controlled amplifier of claim 1 wherein said signal feedback means comprises:

1. first impedance means operatively connected between said output circuit means and said input circuit means for at least partially determining the transfer function of said amplifier;
2. electronic switching means operatively connected to said control circuit means and to said input circuit means; and,
3. second impedance means operatively connected to said output circuit means and to said electronic switching means, said second impedance means being operable to at least partially determine the transfer function of said amplifier in response to said electronic switching means.

5. The digitally controlled amplifier of claim 4 wherein said electronic switching means comprises:

a. first and second diodes, the cathode electrode of said first diode being connected to the like electrode of said second diode, the anode electrode of said first diode being connected to said input circuit means, the anode electrode of said second diode being connected to the output terminal of said control circuit means, and wherein said second impedance means is connected to the intersection of said cathode electrode of said first and second diodes.

6. A digitally controlled amplifier having a gain proportional to a selectable digital number comprising:

a. an operational amplifier having an input terminal and an output terminal;
b. first signal feedback means connected in a first signal feedback path between said input terminal and said output terminal for at least partially determining a first transfer function of said amplifier;
c. second signal feedback means connected in a second signal feedback path for partially determining a second transfer function of said amplifier;
d. switching means in said second signal feedback path for selectively connecting said second signal feedback means in said second signal feedback path;
e. pulse generating means for generating a series of electrical pulses;
f. circuit means responsive to said digital number and operatively connected to said pulse generating means for providing first and second digital output signals of the same frequency having a phase difference proportional to said digital number; and
g. control circuit means responsive to the phase difference between the first and second digital output signals and connected to said circuit means for generating an output signal to operate said switching means, said output signal having a first voltage level for a selectable percentage of a predetermined time period and a second voltage level for the remainder of said time period, whereby the transfer function of said amplifier is a first predetermined value for the duration of the selectable percentage of the predetermined time period and is a second predetermined value for the remainder of the time period.

7. The digitally controlled amplifier of claim 6 wherein said circuit means comprises:

1. first pulse counting means for providing a first output signal in response to the counting of a predetermined number of pulses of said series of pulses;
2. second pulse counting means for providing a second output signal in response to the counting of a predetermined number of pulses of said series of pulses; and,
3. preset circuit means operatively connected to said second counting means for presetting said selectable digital number into said second counting means, whereby a phase difference proportional to said selectable digital number is introduced between the output signals of said first and second counting means.

8. A method for digitally controlling the gain of an amplifier comprising the steps of:

a. providing a signal feedback path of a predetermined impedance between an output terminal and an input terminal of said amplifier, the impedance of said signal feedback path at least partially determining the transfer function of said amplifier;
b. generating a digital number;
c. generating digital output signals having a selectable phase difference therebetween proportional to said digital number; and,
d. modifying the transfer function of said amplifier by modifying the impedance of said signal feedback path for a selectable percentage of a predetermined time period in response to the phase relationship between said digital output signals.

9. The method of claim 8 wherein step (c) comprises the steps of:

1. generating a series of electrical pulses;
2. generating a digital reference signal having a frequency related to the frequency of the series of electrical pulses;
3. generating a digital command signal having the same frequency as said reference signal; and,
4. shifting the phase of said command signal relative to said reference signal by an amount proportional to said digital number.

10. The method of claim 8 wherein step (d) comprises the steps of:

1. switching a feedback impedance into said feedback path in response to one of said digital output signals; and,
2. switching said signal feedback impedance out of said feedback path in response to the other of said digital output signals.

11. A digitally controlled amplifier having a gain inversely proportional to a selectable digital number comprising:

a. amplifier means, including a feedback circuit, for amplifying an input signal;
b. a circuit element;
c. switch means for selectively connecting said circuit element into said feedback circuit;
d. circuit means for producing two digital signals having a phase difference proportional to said digital number; and
e. circuit means responsive to said two digital signals for operating said switch means so as to connect said circuit element into said feedback circuit for a time proportional to the phase difference between said digital signals.

12. A method of digitally controlling the gain of an amplifier comprising the steps of:

a. providing a feedback path for the output signal of the amplifier to an input terminal thereof during a predetermined time period;
b. generating a digital number;
c. generating a first digital reference signal;
d. generating a second digital signal differing in phase from the reference signal by an amount proportional to said digital number;
e. detecting the difference in phase between the reference and second signals;
f. generating a digital control signal in response to said phase difference; and
g. modifying the impedance of the feedback path during the predetermined time period in response to the digital control signal.

* * * * *